United States Patent
Sahota et al.

(10) Patent No.: US 6,927,113 B1
(45) Date of Patent: Aug. 9, 2005

(54) SEMICONDUCTOR COMPONENT AND METHOD OF MANUFACTURE

(75) Inventors: Kashmir S. Sahota, Fremont, CA (US); Jeremy Martin, Annandale On Hudson, NY (US); Richard J. Huang, Cupertino, CA (US); James J. Xie, San Jose, CA (US)

(73) Assignee: Advanced Micro Devices, Sunnyvale, CA (US)

( * ) Notice: Subject to any disclaimer, the term of this patent is extended or adjusted under 35 U.S.C. 154(b) by 19 days.

(21) Appl. No.: 10/444,353

(22) Filed: May 23, 2003

(51) Int. Cl.$^7$ ........................................ H01L 21/8238
(52) U.S. Cl. ............................................ 438/200
(58) Field of Search .................. 438/15, 3, 669, 438/709, 630, 637, 597, 299, 448, 396, 253, 438/200; 257/288, 200, 298

(56) References Cited

U.S. PATENT DOCUMENTS

| | | |
|---|---|---|
| 6,259,160 B1 | 7/2001 | Lopatin et al. |
| 6,303,505 B1 | 10/2001 | Ngo et al. |
| 6,306,732 B1 * | 10/2001 | Brown ...................... 438/468 |
| 6,335,283 B1 | 1/2002 | Ngo et al. |
| 6,432,822 B1 | 8/2002 | Ngo et al. |
| 6,451,683 B1 | 9/2002 | Farrar |
| 6,451,688 B1 | 9/2002 | Shimpuku |
| 6,455,409 B1 | 9/2002 | Subramanian et al. |
| 6,455,415 B1 | 9/2002 | Lopatin et al. |
| 6,455,417 B1 | 9/2002 | Bao et al. |
| 6,455,425 B1 | 9/2002 | Besser et al. |
| 6,455,938 B1 | 9/2002 | Wang et al. |
| 6,457,477 B1 | 10/2002 | Young et al. |
| 6,458,679 B1 | 10/2002 | Paton et al. |
| 6,459,155 B1 | 10/2002 | Subramanian et al. |
| 6,635,498 B2 * | 10/2003 | Summerfelt et al. ........... 438/3 |

* cited by examiner

*Primary Examiner*—Craig A. Thompson
*Assistant Examiner*—Monica D. Harrison
(74) *Attorney, Agent, or Firm*—Paul Drake; Rennie William Dover

(57) ABSTRACT

A semiconductor component and a method for manufacturing the semiconductor component that mitigates electromigration and stress migration in a metallization system of the semiconductor component. A hardmask is formed over a dielectric layer and an opening is etched through the hardmask and into the dielectric layer. The opening is lined with a barrier layer and filled with an electrically conductive material. The electrically conductive material is planarized, where the planarization process stops on the barrier layer. Following planarization, the electrically conductive material is recessed using either an over-polishing process with highly selective copper slurry or a wet etching process to partially re-open the filled metal-filled trench or via. The recess process is performed such that the exposed portion of the electrically conductive material is below the dielectric layer. A capping layer is then deposited on both the dielectric portion and the exposed metal interconnect portion of the electrically conductive material.

24 Claims, 2 Drawing Sheets

SEMICONDUCTOR COMPONENT AND METHOD OF MANUFACTURE

FIELD OF THE INVENTION

The present invention relates, in general, to a metallization system suitable for use in a semiconductor component and, more particularly, to a semiconductor component having a metallization system capable of mitigating electromigration and stress migration, to a method for manufacturing the semiconductor component, and to a method for mitigating electromigration and stress migration.

BACKGROUND OF THE INVENTION

Semiconductor component manufacturers are constantly striving to increase the speeds of their components. Because a semiconductor component, such as a microprocessor, contains up to a billion transistors or devices, the focus for increasing speed has been to decrease gate delays of the semiconductor devices that make up the semiconductor component. As a result, the gate delays have been decreased to the point that speed is now primarily limited by the propagation delay of the metallization system used to interconnect the semiconductor devices with each other and with elements external to the semiconductor component. Metallization systems are typically comprised of a plurality of interconnect layers vertically separated from each other by a dielectric material and electrically coupled to each other by metal-filled vias or conductive plugs. Each layer contains metal lines, metal-filled vias, or combinations thereof separated by an insulating material. A figure of merit describing the delay of the metallization system is its Resistance-Capacitance (RC) delay. The RC delay can be derived from the resistance of the metal layer and the associated capacitance within and between different layers of metal in the metallization system. More particularly, the RC delay is given by:

$$RC = (\rho * \epsilon l^2 / (t_m * t_{diel}))$$

where:

ρ is the resistivity of the metallic interconnect layer;

ε is the dielectric constant or permittivity of the dielectric material;

l is the length of the metallic interconnect;

$t_m$ is the thickness of the metal; and $t_{ox}$ is the thickness of the dielectric material.

One way to decrease the RC delay is to decrease the resistivity of the metallic interconnect layers and the resistivity of the conductive plugs that electrically couple the interconnect layers to each other. Two commonly used techniques for forming low resistivity metallization systems are the single-damascene process and the dual-damascene process. In the single-damascene process, trenches and/or vias are etched into a first dielectric layer and subsequently filled with metal. A second dielectric layer is formed over the first dielectric layer and trenches and/or vias are formed therein. The trenches and/or vias in the second dielectric layer are then filled with metal, wherein the metal in the vias contacts the metal in selected vias or trenches in the first dielectric layer. In the dual-damascene process, two levels of trenches and/or vias are formed using one or multiple layers of dielectric material. The trenches and/or vias are then filled with metal in a single step such that the metal in a portion of the vias contacts the metal in a portion of the trenches. Typically, after formation of the trenches and/or vias and before filling them with metal, the trenches and/or vias are lined with an electrically conductive barrier layer, which prevents diffusion of copper through the sidewalls of the trenches and/or vias. Although the barrier layer lines the metal within the trenches and vias on three sides, i.e., the sidewalls and floors, the top surface of the trench-filling and via-filling metal are not lined. A drawback to leaving the top surface unlined is that when current is being conducted through these structures voids are created by electromigration and stress migration. These voids increase the resistance of the metallization system and degrade the performance of the semiconductor component.

Accordingly, what is needed is a method for mitigating void formation in a semiconductor component as well as a semiconductor component having a void formation mitigation element and a method for manufacturing a semiconductor component having the void formation mitigation element.

SUMMARY OF THE INVENTION

The present invention satisfies the foregoing need by providing a semiconductor component and a method for manufacturing the semiconductor component capable of mitigating void formation. In accordance with one aspect, the present invention includes providing a semiconductor substrate having a semiconductor device formed therefrom. An interconnect layer is formed over the semiconductor device, wherein the interconnect layer includes an electrically conducting portion coupled to the major surface. A dielectric material is formed over the interconnect layer and a hardmask is formed over the dielectric material. An opening having sidewalls is formed through the hardmask and into the dielectric material. A barrier layer is formed over the hardmask and the sidewalls of the opening to form a barrier-lined opening. The barrier-lined opening is filled with an electrically conductive material and the electrically conductive material is planarized. The filled barrier-lined opening is partially recessed through either selective polishing or a wet etching process, and a capping layer is formed on the electrically conductive material within the partially recessed opening.

In accordance with another aspect, the present invention comprises a method for reducing electromigration and stress migration in a semiconductor component. A damascene structure over a lower electrically conductive level is fabricated, wherein the damascene structure includes a dielectric material having a major surface and an opening extending into the dielectric material. The opening and a portion of the major surface are lined with a barrier layer to form a barrier-lined opening. The barrier-lined opening is filled with metal to form a metal-filled barrier-lined opening, which is then recessed so that an exposed surface of the metal-filled barrier-lined opening is below the major surface of the dielectric material. A capping layer is formed on the exposed surface of the metal-filled barrier-lined opening.

In accordance with yet another aspect, the present invention comprises a semiconductor component having a damascene structure over a lower electrically conductive level. The damascene structure comprises a dielectric material having a major surface and an opening extending into the dielectric material, wherein the opening and a portion of the major surface are lined with a barrier layer. An electrically conductive material is disposed on the barrier layer in the opening. The damascene structure is recessed by selective polishing or by a wet etching process so that the electrically conductive material disposed on the barrier layer is below the major surface of the barrier layer and the dielectric material. A capping layer is formed over the electrically conductive material disposed on the barrier layer.

BRIEF DESCRIPTION OF THE DRAWINGS

The present invention will be better understood from a reading of the following detailed description, taken in conjunction with the accompanying drawing figures, in which like reference numbers designate like elements and in which.

DETAILED DESCRIPTION

Generally, the present invention provides a semiconductor component having a multi-layer interconnect structure and a method for reducing electromigration and stress migration of a metal such as copper in the multi-layer interconnect structure. In accordance with one aspect of the present invention, a barrier layer is used to constrain the movement of copper atoms in the copper lines that make up the interconnect structure. The interconnect structure is manufactured using, for example, a damascene process, by forming a via in a dielectric stack comprising an insulating layer having an anti-reflective coating (ARC) layer disposed thereon. The via is lined with a barrier layer and then filled with copper. The copper is planarized (or polished) and recessed to form recessed copper-filled vias. A capping layer is formed in and over the recessed portions. The capping layer is made of a harder metal than copper and, while allowing the flow of current, prevents migration of the copper atoms. The capping layer and, optionally, a portion of the barrier layer are polished, leaving copper interconnect surrounded by a sidewall portion of the barrier layer and the capping layer. An advantage of forming a capping layer on a recessed copper-filled trench or recessed copper-filled via is that electromigration and/or stress migration are reduced using a structure that is readily manufacturable and cost effective to build.

Figure 1:
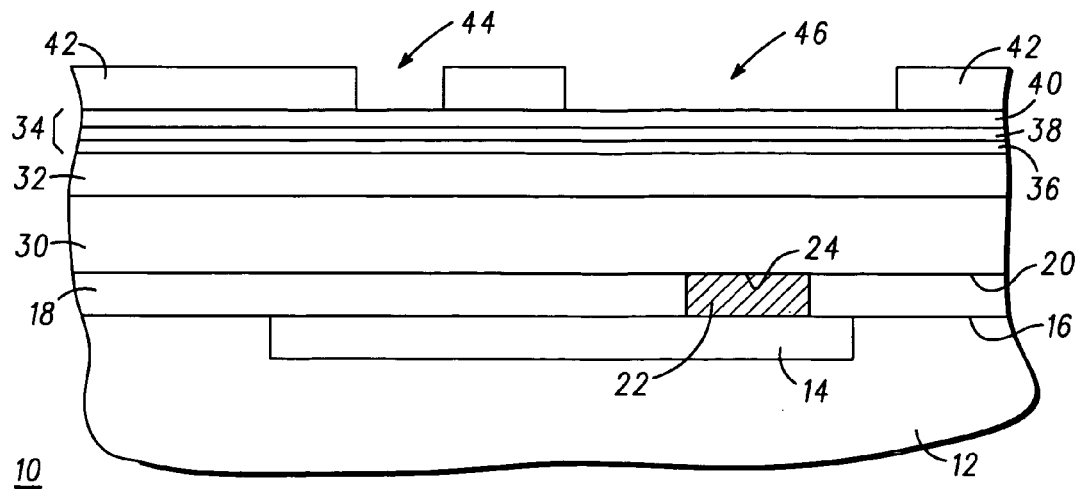
FIGS. 1–6 are enlarged cross-sectional side views of a semiconductor component during manufacture in accordance with an embodiment of the present invention.

FIG. 1 is an enlarged cross-sectional side view of a semiconductor component 10 during an intermediate stage of manufacture in accordance with an embodiment of the present invention. What is shown in FIG. 1 is a portion of a semiconductor substrate 12 in which a semiconductor device 14 has been fabricated. Semiconductor substrate 12 has a major surface 16. It should be understood that semiconductor device 14 has been shown in block form and that the type of semiconductor device is not a limitation of the present invention. Suitable semiconductor devices include active elements such as, for example, insulated gate field effect transistors, complementary insulated gate field effect transistors, junction field effect transistors, bipolar junction transistors, diodes, and the like, as well as passive elements such as, for example, capacitors, resistors, and inductors. Likewise, the material of semiconductor substrate 12 is not a limitation of the present invention. Substrate 12 can be silicon, Silicon-On-Insulator (SOI), Silicon-On-Sapphire (SOS), silicon germanium, germanium, an epitaxial layer of silicon formed on a silicon substrate, or the like. In addition, semiconductor substrate 12 may be comprised of compound semiconductor materials such as gallium-arsenide, indium-phosphide, or the like.

A dielectric material 18 having a major surface 20 is formed on semiconductor substrate 12 and an electrically conductive portion 22 having a major surface 24 is formed in a portion of dielectric material 18. By way of example, electrically conductive portion 22 is metal. Metal layer 22 may be referred to as Metal-1 or a lower electrically conductive level. The combination of dielectric material 18 and electrically conductive portion 22 is referred to as an interconnect layer. When electrically conductive portion 22 is metal, the interconnect layer is also referred to as a metal interconnect layer. Techniques for forming semiconductor devices such as device 14, dielectric material 18, and metal layer 22 are known to those skilled in the art.

A layer of dielectric or insulating material 30 having a thickness ranging between approximately 1,000 Angstroms (Å) and approximately 25,000 Å is formed on major surfaces 20 and 24. Even more preferably, insulating layer 30 has a thickness ranging between 2,000 Å and 12,000 Å. By way of example, dielectric layer 30 has a thickness of about 5,000 Å and comprises a material having a dielectric constant ($\kappa$) lower than that of silicon dioxide, silicon nitride, and hydrogenated oxidized silicon carbon material (Si-COH). Suitable organic dielectric materials include, but are not limited to, polyimide, spin-on polymers, poly(arylene ether) (PAE), parylene, xerogel, fluorinated aromatic ether (FLARE), fluorinated polyimide (FPI), dense SiLK, porous SiLK (p-SiLK), polytetrafluoroethylene, and benzocyclobutene (BCB). Suitable inorganic low $\kappa$ dielectric materials include, but are not limited to, hydrogen silsesquioxane (HSQ), methyl silsesquioxane (MSQ), fluorinated glass, or NANOGLASS. It should be understood that the type of dielectric material for insulating layer 30 is not a limitation of the present invention and that other organic and inorganic low $\kappa$ dielectric materials may be used, especially dielectric materials having a dielectric constant less than that of silicon dioxide. Similarly, the method for forming insulating layer 30 is not a limitation of the present invention. For example, insulating layer 30 may be formed using, among other techniques, spin-on coating, Chemical Vapor Deposition (CVD), Plasma Enhanced Chemical Vapor Deposition (PECVD), or Physical Vapor Deposition (PVD).

A layer of dielectric material 32 having a thickness ranging from approximately 500 Å to approximately 5,000 Å is formed on insulating layer 30. Suitable materials and deposition techniques are the same as those listed for insulating layer 30. Although the material of dielectric layer 32 may be the same as that of insulating layer 30, preferably the dielectric materials are different. In addition, it is preferable that the materials of dielectric layer 32 and insulating layer 30 have different etch rates, yet have similar coefficients of thermal expansion and be capable of withstanding the stress levels brought about by processing and use as a final product.

In accordance with one embodiment, the dielectric material of insulating layer 30 is p-SILK and the material of dielectric layer 32 is silicon oxynitride (SiON). Other suitable materials for dielectric layer 32 include silicon carbide and Ensemble (Ensemble is an interlayer dielectric coating sold by The Dow Chemical Co.). These materials can be applied using a spin-on coating technique and they have similar stress level tolerances and processing temperature tolerances. Moreover, these materials can be selectively or differentially etched with respect to each other. In other words, etchants are available that selectively etch the p-SILK and silicon oxynitride, i.e., an etchant can be used to etch the p-SILK but not significantly etch the silicon oxynitride and another etchant can be used to etch the silicon oxynitride but not significantly etch the p-SILK.

In accordance with another embodiment, the dielectric material of insulating layer 30 is foamed polyimide and the dielectric material of dielectric layer 32 is HSQ. Layers 30 and 32 cooperate to form an insulating material. Although these embodiments illustrate the use of an organic and an inorganic dielectric material, this is not a limitation of the present invention. The dielectric materials of insulating layer 30 and dielectric layer 32 can both be either organic materials or inorganic materials.

Still referring to FIG. 1, a hardmask 34 is formed on dielectric layer 32. The hardmask is also referred to as a hardmask stack or an Anti-Reflective Coating (ARC) layer. By way of example, hardmask 34 is a tri-layer system comprising silicon carbide, titanium nitride, and silicon carbide. More particularly, a layer of silicon carbide (SiC) 36 having a thickness ranging between approximately 400 Å and approximately 700 Å is disposed on dielectric layer 32. A layer of titanium nitride (TiN) 38 having a thickness ranging between approximately 300 Å and approximately 500 Å is disposed on silicon carbide layer 36. A layer of silicon carbide 40 having a thickness ranging between approximately 500 Å and approximately 1,000 Å is disposed on titanium nitride layer 38. Thus, titanium nitride layer 38 is sandwiched between silicon carbide layers 36 and 40. Silicon carbide layer 36 serves as an adhesion promotion layer so that titanium nitride layer 38 does not peel away from semiconductor component 10. Titanium nitride layer 38 serves as an etch stop layer during the formation of vias in insulating layer 30. Silicon carbide layer 40 lowers the reflection of light during the photolithographic steps used in patterning a photoresist layer 42.

Alternatively, hardmask 34 comprises a single layer of a dielectric material such as, for example, silicon oxynitride (SiON), silicon nitride ($Si_xN_y$), silicon rich nitride (SiRN), silicon carbide (SiC), and hydrogenated oxidized silicon carbon material (SiCOH).

Photoresist layer 42 is formed on silicon carbide layer 40 and patterned to form openings 44 and 46 using techniques known to those skilled in the art.

Figure 2:
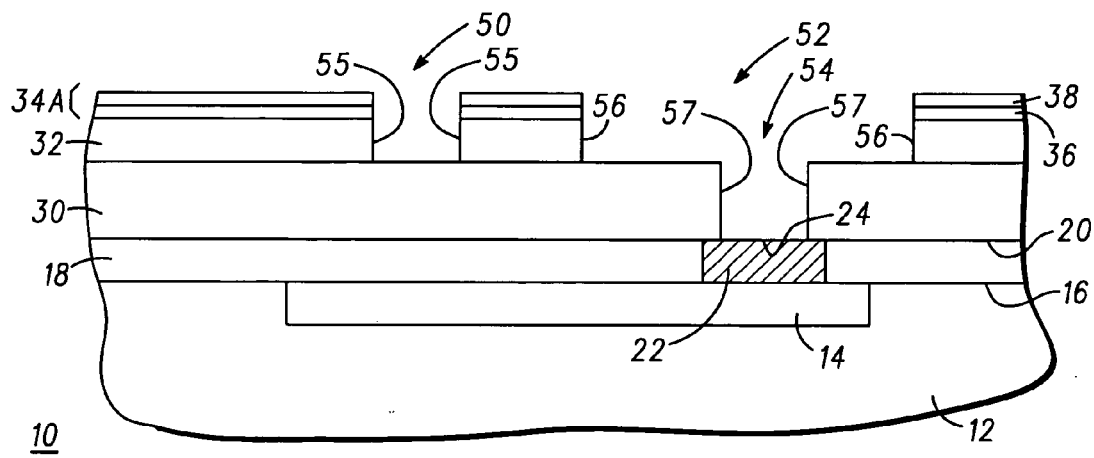

Referring now to FIG. 2, the portions of hardmask 34, i.e., silicon carbide layer 40, titanium nitride layer 38, silicon carbide layer 36, and dielectric layer 32, that are not protected by patterned photoresist layer 42, i.e., the portions not underlying patterned photoresist layer 42 are sequentially etched using an anisotropic reactive ion etch to form openings 50 and 52 having sidewalls 55 and 56, respectively. The anisotropic etch stops or terminates in or on insulating layer 30. In other words, the portions of silicon carbide layer 40, titanium nitride layer 38, silicon carbide layer 36, and dielectric layer 32 underlying openings 44 and 46 are removed using the anisotropic reactive ion etch. Photoresist layer 42 is removed using techniques known to those skilled in the art.

Another layer of photoresist (not shown) is formed on the remaining portions of silicon carbide layer 40 and fills openings 50 and 52. The photoresist layer is patterned to form an opening (not shown) that exposes a portion of insulating layer 30 within photoresist-filled opening 52. The exposed portion of insulating layer 30 is etched using a reactive ion etch to form an inner opening 54 having sidewalls 57 that exposes a portion of conductive layer 22. Thus, the reactive ion etch stops on conductive layer 22. When an opening such as opening 50 will be used to electrically couple vertically spaced apart interconnect layers it is referred to as a via or an interconnect via, whereas when an opening such as opening 52 will be used to horizontally route electrically conductive lines or interconnects it is referred to as a trench or an interconnect trench. The photoresist layer and silicon carbide layer 40 are removed using techniques known to those skilled in the art. Because silicon carbide layer 40 has been removed, the remaining portion of the hardmask has been identified by reference number 34A.

Figure 3:
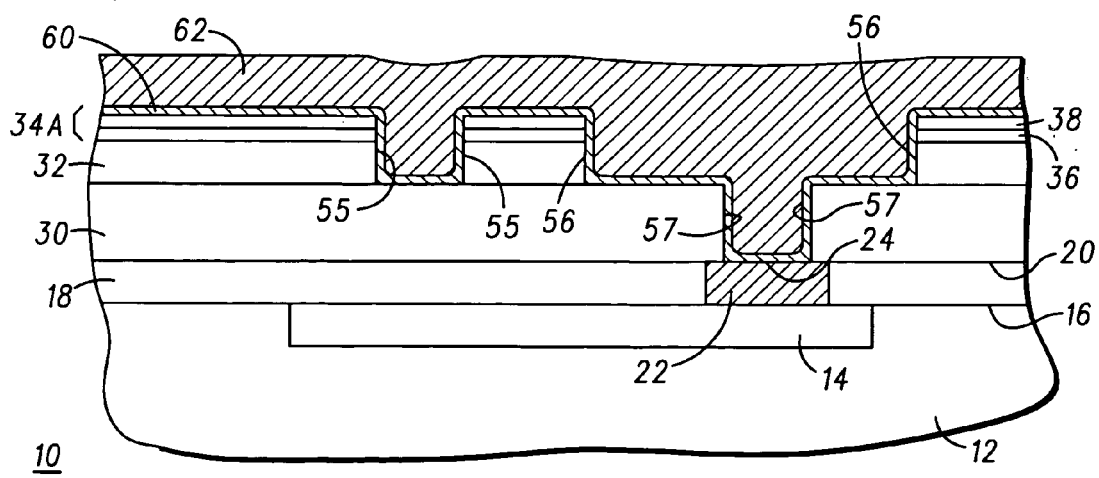

Referring now to FIG. 3, a layer of tantalum 60 having a thickness ranging between approximately 200 Å and approximately 350 Å is formed on titanium nitride layer 38 and in openings 50, 52, and 54 (shown in FIG. 2). Tantalum layer 60 may be formed using Chemical Vapor Deposition (CVD), Plasma Enhanced Chemical Vapor Deposition (PECVD), sputtering, evaporation, or the like. Preferably, tantalum layer 60 is conformally deposited on titanium nitride layer 38 and in openings 50, 52, and 54 to form a barrier-lined opening. Tantalum layer 60 serves as a barrier layer to prevent diffusion from a subsequently deposited metal into insulating layer 30, dielectric layer 32, hardmask 34A, or semiconductor device 14. In addition, tantalum layer 60 provides a low contact resistance between conductive layer 22 and a metal filling opening 54. Other suitable materials for barrier layer 60 include titanium (Ti), titanium nitride (TiN), tantalum nitride (TaN), a combination of tantalum (Ta) and tantalum nitride (TaN), where the tantalum nitride is sandwiched between the tantalum and the surfaces of openings 50, 52, and 54; tungsten (W), tungsten nitride (WN), titanium silicon nitride (TiSiN), and refractory metal compounds such as refractory metal nitrides, refractory metal carbides, or refractory metal borides.

A film or layer 62 of an electrically conductive material is formed on barrier layer 60 and fills openings 50, 52, and 54, thereby forming a metal-filled barrier-lined opening. By way of example layer 62 is copper which is plated on barrier layer 60. Techniques for plating copper on a barrier film are known to those skilled in the art. Alternatively, layer 62 may be aluminum or silver.

Figure 4:
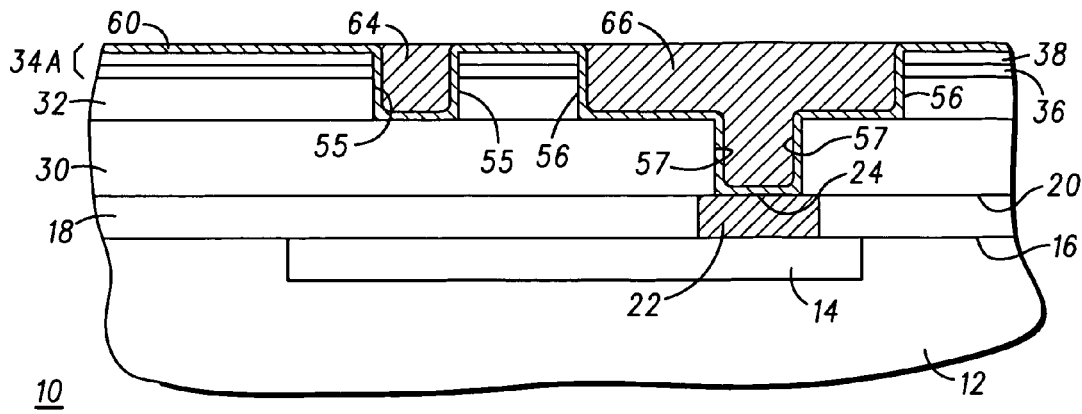

Referring now to FIG. 4, copper film 62 is planarized using, for example, a Chemical Mechanical Polishing (CMP) technique having a high selectivity to barrier layer 60. Thus, the planarization stops on barrier layer 60. After planarization, portion 64 of copper film 62 remains in opening 50 and portion 66 of copper film 62 remains in openings 52 and 54 (shown in FIG. 2). As those skilled in the art are aware, Chemical Mechanical Polishing is also referred to as Chemical Mechanical Planarization. Other suitable planarization techniques include electropolishing, electrochemical polishing, chemical polishing, and chemical enhanced planarization.

Figure 5:
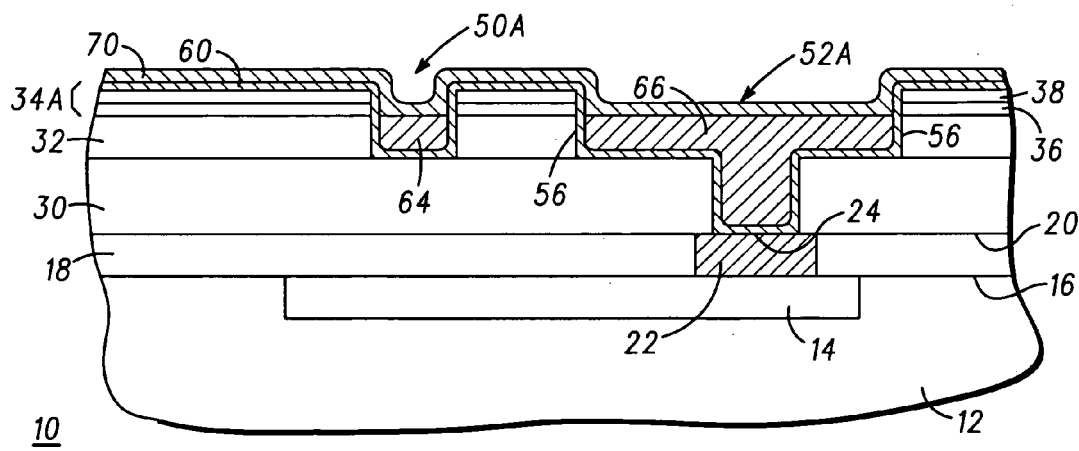

Referring now to FIG. 5, portions 64 and 66 of copper film 62 are removed by overpolishing using a high selectivity slurry (e.g., a slurry having a copper-to-tantalum selectivity of 100 to 1000 when tantalum is the barrier material and copper is disposed on the tantalum) or by etching using a controlled wet copper etch such that portions 64 and 66 are partially recessed to form openings 50A and 52A, respectively. Because the etch partially re-opens openings 50 and 52, the letter "A" has been appended to reference numbers 50 and 52 to identify the partially re-opened openings. It should be noted that portions 64 and 66 are preferably etched to be below silicon carbide layer 38 of hardmask 34A. Preferably, the thickness of barrier layer 60 is not reduced by more than 50 Å by overpolishing or wet etching processes; however, a high selectivity copper chemical mechanical planarization (CMP) process will keep a substantial amount of barrier layer 60 on hardmask 34A.

A layer of electrically conductive material 70 such as, for example, tantalum is deposited on the remaining portions of barrier layer 60 and on portions 64 and 66 of copper layer 62 that are in openings 50A and 52A, respectively. Layer 70 is also referred to as a capping layer. Preferably, electrically conductive layer 70 has a thickness ranging between approximately 50 Å and approximately 500 Å and is conformally deposited on barrier layer 70 and on portions 64 and 66. Other suitable materials for electrically conductive layer 70 include titanium nitride (TiN), tantalum nitride (TaN), tungsten (W), tungsten nitride (WN), titanium silicon nitride (TiSiN), and cobalt tungsten phosphorus (CoWP), or combinations thereof that have lower resistivity.

Figure 6:
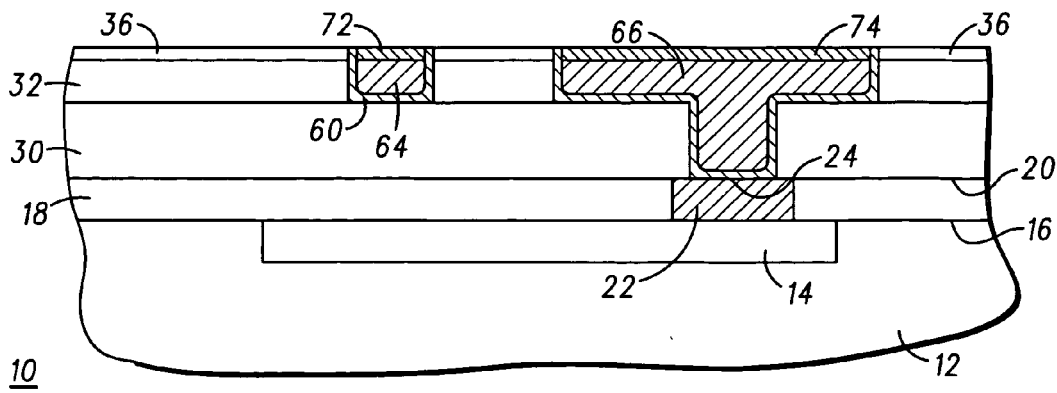

Referring now to FIG. 6, electrically conductive material 70, barrier layer 60, and hardmask 34A are planarized using for example, a CMP technique. After planarization, a portion of silicon carbide layer 38 may remain over dielectric layer 32, and portions 72 and 74 of electrically conductive layer 70 will be self-aligned over the respective conductive portions 64 and 66 of copper layer 62. Thus, portions 64 and 66 are completely enclosed by the capping and barrier layers and are precluded from migrating during operation. By preventing copper migration, void formation and the associated increase in resistance are mitigated.

By now it should be appreciated that a method for mitigating electromigration and stress migration, a semiconductor component having a means for mitigating electromigration and stress migration, and a method for manufacturing the semiconductor component have been provided. The method includes forming a damascene structure having a barrier-lined opening over a lower level metal layer, wherein the barrier-lined opening is filled with an electrically conductive material such as, for example, copper. The filled barrier-lined opening is recessed using, for example, a controlled selective overpolishing process or a wet etch process. Then, a capping layer is formed on the electrically conductive material in the recessed regions. An advantage of the present invention is that the capping layer mitigates electromigration of the electrically conductive material by blocking the migration of atoms from the electrically conductive material and stress migration by modifying the copper-to-dielectric interfacial tension. The mitigation of electromigration and stress migration decreases void formation, which prevents an increase in the resistivity of the metallization system. The method for forming the capping layer is particularly suitable for use in semiconductor components having multi-level metallization systems comprising damascene structures over lower metal layers because forming the capping layer in recessed filled openings maintains the planarity of the interconnect layers. Thus, the present invention improves the manufacturability of the semiconductor components. By using highly selective overpolishing to create copper recesses, the present invention makes the entire manufacturing process even more cost efficient.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law. For example, the metallization system may comprise one, two, or more horizontal interconnect layers.

What is claimed is:

1. A method for manufacturing a semiconductor component, comprising:
   providing a semiconductor substrate having a major surface and a semiconductor device formed therefrom and further providing an interconnect layer over the major surface;
   forming a dielectric material over the interconnect layer;
   forming a hardmask over the dielectric material, the hardmask having a major surface;
   forming an opening through the hardmask and into the dielectric material, the opening having sidewalls;
   forming a barrier layer over the major surface of the hardmask and the sidewalls of the opening to form a barrier-lined opening;
   filling the barrier-lined opening with an electrically conductive material;
   partially re-opening the barrier-lined opening; and
   forming a capping layer on the electrically conductive material within the partially re-opened opening.

2. The method of claim 1, wherein providing a semiconductor device includes providing at least one semiconductor device selected from the group of semiconductor devices comprising an insulated gate field effect transistor, a junction field effect transistor, a bipolar junction field effect transistor, a resistor, a capacitor, and an inductor.

3. The method of claim 1, wherein forming the opening through the hardmask comprises anisotropically etching the hardmask.

4. The method of claim 1, wherein forming the hardmask comprises:
   forming a first layer of silicon carbide over the dielectric material;
   forming a layer of titanium nitride over the first layer of silicon carbide; and
   forming a second layer of silicon carbide over the layer of titanium nitride.

5. The method of claim 1, wherein forming the hardmask comprises forming a layer of silicon oxynitride over the dielectric material.

6. The method of claim 1, wherein forming the barrier layer comprises depositing a layer of material selected from the group of materials consisting of titanium, tungsten, tantalum nitride, silicon nitride, a refractory metal compound, a refractory metal carbide, and a refractory metal boride.

7. The method of claim 1, wherein forming the barrier layer comprises:
   forming a layer of tantalum on the hardmask; and
   forming a layer of tantalum nitride on the layer of tantalum.

8. The method of claim 1, wherein forming the barrier layer comprises forming a layer of tantalum on the hardmask.

9. The method of claim 1, wherein the electrically conductive material is copper.

10. A method for manufacturing a semiconductor component, comprising:
    forming a damascene structure over a lower metal level, the damascene structure comprising an insulating material having a major surface and an opening extending into the insulating material, the opening and a portion of the major surface lined with a barrier layer and further comprising an electrically conductive material disposed on the barrier layer in the opening;

recessing the damascene structure so that the electrically conductive material disposed on the barrier layer is below the major surface of the insulating material; and forming a capping layer over the electrically conductive material disposed on the barrier layer.

11. The method of claim 10, wherein forming the damascene structure comprises:

forming a first layer of dielectric material over the electrically conductive material; and forming a second layer of dielectric material over the first layer of dielectric material, wherein the first and second layers of dielectric material cooperate to form the insulating material.

12. The method of claim 11, wherein the first layer of dielectric material is an organic dielectric material and the second layer of dielectric material is an inorganic dielectric material.

13. The method of claim 11, further including etching a trench in the second layer of dielectric material and a via in the first layer of dielectric material, the trench and the via having sidewalls.

14. The method of claim 13, further including forming the barrier layer by depositing a metal layer on the major surface of the insulating material and in the trench and the via.

15. The method of claim 14, wherein the barrier material is selected from the group of barrier materials consisting of tantalum, titanium, tungsten, tantalum nitride, silicon nitride, a refractory metal compound, a refractory metal carbide, and a refractory metal boride.

16. The method of claim 15, further including forming the electrically conductive material by depositing copper on the barrier material.

17. The method of claim 16, further including planarizing the electrically conductive material using a technique selected from the group of techniques consisting of chemical mechanical polishing, electropolishing, electrochemical polishing, chemical polishing, and chemical enhanced polishing.

18. The method of claim 17, wherein recessing the electrically conductive material includes using one of overpolishing the electrically conductive material using a slurry having a copper to tantalum selectivity of about 100 to about 1000 or etching the electrically conductive material using a wet etchant.

19. The method of claim 18, wherein forming the capping layer includes depositing a layer of tantalum over the electrically conductive material and the portion of the barrier layer disposed on the major surface of the dielectric layer and polishing the capping layer so that the portions of the capping layer and the barrier layer over the dielectric material are removed and the portion of the capping layer over the electrically conductive layer remains.

20. A method for reducing electromigration in a semiconductor component, comprising:

providing a damascene structure over a lower electrically conductive level, the damascene structure comprising a dielectric material having a major surface and an opening extending into the dielectric material;

lining the opening and a portion of the major surface with a barrier layer to form a barrier-lined opening;

filling the barrier-lined opening with metal to form a metal-filled barrier-lined opening;

recessing the metal filled barrier-lined opening so that an exposed surface of the metal-filled barrier-lined opening is below the major surface of the dielectric material; and forming a capping layer on the exposed surface of the metal-filled barrier-lined opening.

21. The method of claim 20, wherein recessing the metal-filled barrier-lined opening includes planarizing the metal using a technique selected from the group of techniques consisting of chemical mechanical planarization, electropolishing, electrochemical polishing, chemical polishing, and chemical enhanced polishing, and etching the metal using a wet etchant suitable for etching the metal.

22. The method of claim 20, wherein recessing the metal-filled barrier-lined opening includes recessing such that the capping layer is below the major surface of the dielectric material using a process selected from the group of processes consisting of selective overpolishing and etching.

23. The method of claim 20, wherein filling the barrier-lined opening includes filling with copper.

24. The method of claim 20, wherein the barrier layer comprises a material selected from the group of materials consisting of tantalum, titanium, tungsten, tantalum nitride, silicon nitride, a refractory metal compound, a refractory metal carbide, and a refractory metal boride.

* * * * *